(12) United States Patent
Bushnaq et al.

(10) Patent No.: US 11,152,069 B2
(45) Date of Patent: Oct. 19, 2021

(54) SEMICONDUCTOR STORAGE DEVICE

(71) Applicant: TOSHIBA MEMORY CORPORATION, Tokyo (JP)

(72) Inventors: Sanad Bushnaq, Yokohama Kanagawa (JP); Noriyasu Kumazaki, Kawasaki Kanagawa (JP); Masashi Yamaoka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 46 days.

(21) Appl. No.: 16/557,754

(22) Filed: Aug. 30, 2019

(65) Prior Publication Data

US 2020/0202937 A1 Jun. 25, 2020

(30) Foreign Application Priority Data

Dec. 20, 2018 (JP) .............................. JP2018-238456

(51) Int. Cl.
| | | |
|---|---|---|
| *G11C 16/08* | (2006.01) | |
| *G11C 16/04* | (2006.01) | |
| *H01L 27/11556* | (2017.01) | |
| *G11C 16/14* | (2006.01) | |
| *G11C 16/24* | (2006.01) | |
| *G11C 16/10* | (2006.01) | |
| *G11C 16/26* | (2006.01) | |

(52) U.S. Cl.
CPC .......... *G11C 16/08* (2013.01); *G11C 16/0483* (2013.01); *G11C 16/14* (2013.01); *G11C 16/24* (2013.01); *H01L 27/11556* (2013.01); *G11C 16/10* (2013.01); *G11C 16/26* (2013.01)

(58) Field of Classification Search
CPC .................................................. G11C 16/08
USPC .................................................... 365/185.11
See application file for complete search history.

(56) References Cited

U.S. PATENT DOCUMENTS

| | | | |
|---|---|---|---|
| 7,269,070 B2 | 9/2007 | Kim | |
| 8,274,837 B2 | 9/2012 | Nakamura | |
| 8,724,391 B2 | 5/2014 | Nakamura et al. | |
| 9,030,883 B2 | 5/2015 | He et al. | |
| 9,786,372 B2 * | 10/2017 | Nam | G11C 16/0483 |
| 10,102,912 B2 | 10/2018 | Hahn | |
| 10,120,584 B2 * | 11/2018 | Shirakawa | G06F 3/0656 |
| 2006/0250850 A1 * | 11/2006 | Lee | G11C 16/3427 365/185.18 |
| 2011/0075499 A1 * | 3/2011 | Lee | G11C 11/4097 365/205 |
| 2012/0243338 A1 | 9/2012 | Nakamura | |
| 2015/0138868 A1 | 5/2015 | Castalino et al. | |
| 2016/0379695 A1 | 12/2016 | Kulkarni et al. | |

FOREIGN PATENT DOCUMENTS

JP 2015176309 A 10/2015

* cited by examiner

*Primary Examiner* — Muna A Techane
(74) *Attorney, Agent, or Firm* — Kim & Stewart LLP

(57) ABSTRACT

According to one embodiment, a semiconductor storage device includes a first memory string including a first memory transistor, a first word line connected to a gate electrode of the first memory transistor, a source line connected to one end of the memory string, and a first connection transistor connected between the first word line and the source line.

8 Claims, 16 Drawing Sheets

SEMICONDUCTOR STORAGE DEVICE

CROSS-REFERENCE TO RELATED APPLICATION

This application is based upon and claims the benefit of priority from Japanese Patent Application No. 2018-238456, filed Dec. 20, 2018, the entire contents of which are incorporated herein by reference.

FIELD

Embodiments described herein relate generally to a semiconductor storage device.

BACKGROUND

A semiconductor storage device that includes a memory string including a first memory transistor, a first word line connected to a gate electrode of the first memory transistor, and a source line connected to one end of the memory string is known.

DETAILED DESCRIPTION

Figure 1:
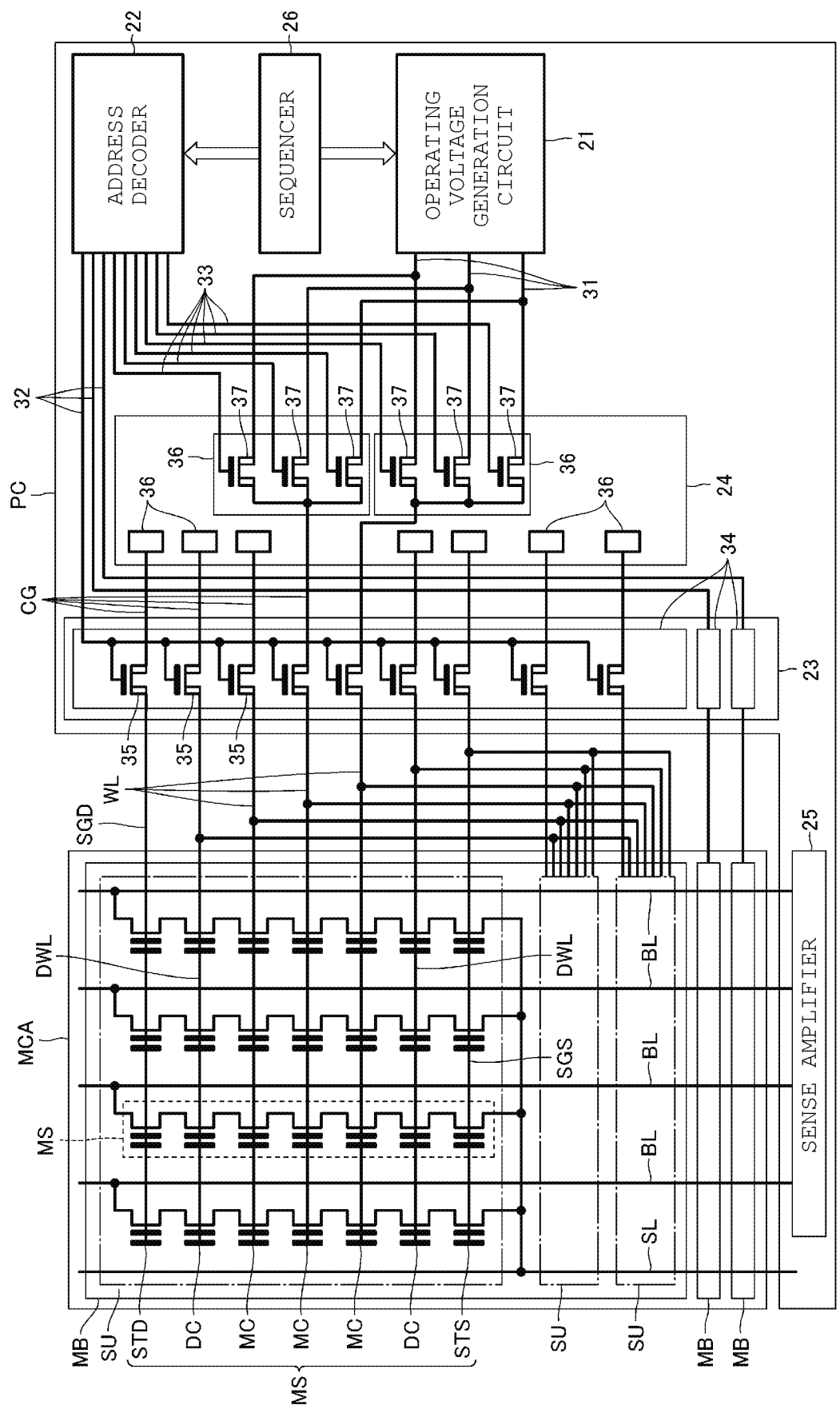
FIG. 1 is a schematic equivalent circuit diagram showing a configuration of a part of a semiconductor storage device according to a first embodiment.

Example embodiments provide semiconductor storage devices capable of operating at high speed.

In general, according to one embodiment, a semiconductor storage device includes a memory string including a first memory transistor, a first word line connected to a gate electrode of the first memory transistor, a source line connected to one end of the memory string, and a first connection transistor connected between the first word line and the source line.

Next, a semiconductor storage device according to example embodiments will be described with reference to the drawings. The following example embodiments are merely examples and should not be understood as limiting the scope of present disclosure.

In the present disclosure, one direction parallel to a surface of a substrate is referred to as an X direction, another direction parallel to the surface of the substrate and perpendicular to the X direction is referred to as a Y direction, and a direction orthogonal to the surface of the substrate is referred to as a Z direction.

In the present disclosure, a direction along a surface may be referred to as a first direction, a direction crossing the first direction yet parallel to the surface may be referred to as a second direction, and a direction crossing the surface may be referred to as a third direction. The first direction, the second direction, and the third direction may or may not correspond to any of the X direction, the Y direction, and the Z direction.

In the present disclosure, expressions such as "up," "upward," "upper," "downward," "lower" and "down" are, in general, used to describe positions and/or directions relative to the substrate. For example, when a direction crosses the surface of the substrate, a direction away from the substrate along this direction is referred to as up, and a direction approaching the substrate along this direction is referred to as down. When an element or aspect is described as having a lower surface or a lower end, the lower surface or end refers to a surface or an end on the side of this element or aspect that is nearest the substrate. Similarly, when referencing an upper surface or an upper end, the upper surface or end corresponds to the surface or end of the element or aspect that is away from the substrate. In addition, any surface crossing one of the second direction or the third direction may be referred to as a side surface or side wall.

In the present disclosure, when a first aspect is described as being "electrically connected" to a second aspect, the first aspect may be directly connected to the second aspect or the first aspect may be connected to the second structure through a conductive wiring, a semiconductor member, a transistor, or the like. For example, when three transistors are connected in series, even though a second (middle) transistor may be in an OFF state, a first (end) transistor is to be considered "electrically connected" to the other third (end) transistor.

In the present disclosure, when a first aspect is described as being "electrically insulated" from the second aspect then this refers to an insulating film or member being provided between the first aspect and the second aspect, such that electricity does not flow between these aspects directly or via a contact, a wiring, or the like.

In the present disclosure, when we say that a circuit or other aspect "electrically connects" two different wirings, elements, or the like, then this includes the use of a switch, a transistor or the like, being provided in a current path between the two wirings, and the switch, transistor or the like being placed in an ON (conductive) state.

Hereinafter, a semiconductor storage device according to example embodiments will be described with reference to the drawings. The drawings are schematic, and for convenience of explanation, some configurations details of certain components may be omitted.

First Embodiment

Circuit Configuration

FIG. 1 is a schematic equivalent circuit diagram showing a configuration of a part of a semiconductor storage device according to a first embodiment.

The semiconductor storage device according to the first embodiment includes a memory cell array MCA and a peripheral circuit PC that controls the memory cell array MCA.

The memory cell array MCA includes a plurality of memory blocks MB. Each of the memory blocks MB includes a plurality of string units SU. Each of the string units SU includes a plurality of memory strings MS. One end of each of the memory strings MS is connected to the peripheral circuit PC through a bit line BL. The other end of each of the memory strings MS is connected to the peripheral circuit PC through a common source line SL.

The memory string MS includes a drain selection transistor STD, one or more dummy cells DC, a plurality of memory cells MC, one or more dummy cells DC, and a source selection transistor STS connected in series between the bit line BL and the source line SL. Hereinafter, the drain selection transistor STD and the source selection transistor STS may be referred to as selection transistors (STD, STS).

In the first embodiment, each memory cell MC is a field effect transistor including a semiconductor layer that functions as a channel region, a gate insulating film including a charge storage film, and a gate electrode. A threshold voltage of the memory cell MC is changed in accordance with a charge amount stored in the charge storage film. In addition, different word lines WL are connected to each of the gate electrodes of the plurality of memory cells MC corresponding to one memory string MS. The word lines WL are commonly connected to (shared with) all the memory strings MS in a memory block MB.

A dummy cell DC is a field effect transistor having a structure similar to that of the memory cell MC. However, the dummy cell DC is not used as a memory (data storage), and differs from the memory cell MC in at least this point. In addition, a dummy word line DWL is connected to the gate electrodes of the dummy cells DC each memory string MS. The dummy word lines DWL are commonly connected to all the memory strings MS in a memory block MB.

The selection transistors (STD, STS) are each a field effect transistor including a semiconductor layer functioning as a channel region, a gate insulating film, and a gate electrode. Selection gate lines (SGD, SGS) are connected to the gate electrodes of the corresponding selection transistors (STD, STS), respectively. The drain selection line SGD is provided for each string unit SU and connected in common to all the memory strings MS in a string unit SU. The source selection line SGS is connected in common to all the memory strings MS in a memory block MB.

The peripheral circuit PC includes an operating voltage generation circuit 21 for generating an operating voltage, an address decoder 22 for decoding address data, a block selection circuit 23 and a voltage selection circuit 24 for transferring the operating voltage to the memory cell array MCA according to an output signal of the address decoder 22, a sense amplifier 25 connected to the bit line BL, and a sequencer 26 for controlling these components The operating voltage generation circuit 21 includes a plurality of operating voltage output terminals 31. For example, the operating voltage generation circuit 21 generates the plurality of operating voltages to be applied to the bit line BL, the source line SL, the word line WL, and the selection gate lines (SGD, SGS) for performing a read operation, a write operation, and an erasing operation on the memory cell array MCA according to a control signal from the sequencer 26, and outputs the operating voltages to a plurality of operating voltage output terminals 31.

The address decoder 22 includes a plurality of block selection lines 32 and a plurality of voltage selection lines 33. For example, the address decoder 22 refers to address data of sequential address register according to the control signal from the sequencer 26, decodes the address data, sets predetermined block selection line 32 and voltage selection line 33 corresponding to the address data as an "H" state (corresponding to a high digital logic value), and sets the other block selection lines 32 and voltage selection lines 33 as an "L" state (corresponding to a low digital logic value).

The block selection circuit 23 includes a plurality of block selection units 34 corresponding to the memory block MB. Each of the block selection units 34 includes a plurality of block selection transistors 35 corresponding to the word lines WL and the selection gate lines (SGD, SGS). The block selection transistor 35 is, for example, a high-breakdown-voltage field effect transistor. One end of each of the block selection transistors 35 is electrically connected to the corresponding word lines WL or selection gate lines (SGD, SGS). Each of the other ends is electrically connected to the operating voltage output terminal 31 through the wiring CG and the voltage selection circuit 24. The gate electrode of each of the block selection transistors 35 is connected to the block selection line 32.

The voltage selection circuit 24 includes a plurality of voltage selection units 36 corresponding to the word lines WL, the dummy word line DWL, and the selection gate lines (SGD, SGS). Each of the voltage selection units 36 includes a plurality of voltage selection transistors 37. The voltage selection transistor 37 is, for example, a high-breakdown-voltage field effect transistor. One end of each of the voltage selection transistors 37 is electrically connected to a corresponding word line WL or selection gate lines (SGD, SGS) through the wiring CG and the block selection circuit 23. Each of the other ends is electrically connected to the corresponding operating voltage output terminal 31. Each gate electrode is connected to the corresponding voltage selection line 33.

The sense amplifier 25 is connected to a plurality of bit lines BL. The sense amplifier 25 includes, for example, a plurality of sense amplifier units corresponding to the bit lines BL. Each of the sense amplifier units includes a clamp transistor for charging the bit line BL on the basis of a voltage generated in the operating voltage generation circuit 21, a sense node connected to the clamp transistor, a data latch, and a sense circuit for causing the data latch to store data of "H" or "L" values according to a voltage or a current of the sense node. In Each sense amplifier unit includes a plurality of other data latches and a logical circuit. For example, in the read operation, the logical circuit evaluates the data stored in the data latch to identify the data stored in the memory cell MC. For example, in the write operation, the logical circuit evaluates the data stored in the data latch to control the voltage of the bit line BL.

The sequencer 26 outputs the control signals to the operating voltage generation circuit 21, the address decoder 22, and the sense amplifier 25 in accordance with an input instruction (command) and a state of the semiconductor storage device. For example, the sequencer 26 refers to command data of a sequential command register in accordance with a clock signal, decodes the command data, and outputs the command data to the gate electrode or the like of the transistors of the operating voltage generation circuit 21, the address decoder 22, and the sense amplifier 25.

Figure 2:
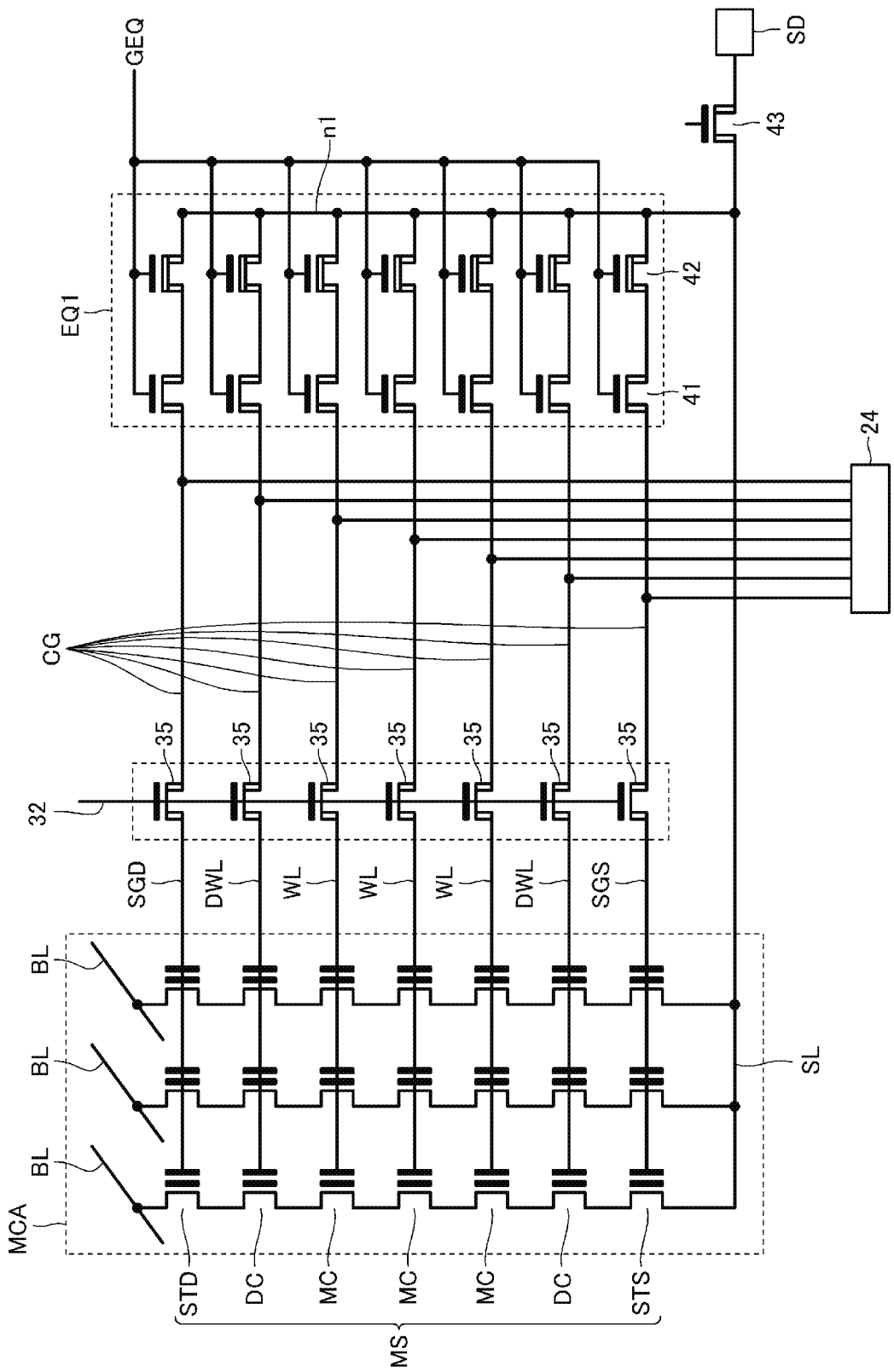
FIG. 2 is a schematic equivalent circuit diagram showing a configuration of a part of a semiconductor storage device according to the first embodiment.

FIG. 2 is a schematic equivalent circuit diagram showing the configuration of a part of the semiconductor storage device according to the first embodiment.

The semiconductor storage device according to the first embodiment includes an equalizer circuit EQ1 in addition to the configuration already described with reference to FIG. 1. The equalizer circuit EQ1 is used, for example, for a recovery operation from an erasing operation for erasing user data stored in the memory cell MC. More specifically, for example, the equalizer circuit EQ1 is used for an operation of discharging a voltage applied to the source line SL or the like in the erasing operation.

The equalizer circuit EQ1 includes a plurality of transistors 41 respectively connected to the plurality of wirings CG, a plurality of transistors 42 respectively connected to the plurality of transistors 41, and a wiring n1 connected in common to the plurality of transistors 42. In the example of FIG. 2, a common wiring GEQ is connected to gate electrodes of the transistors 41 and the transistors 42.

The wiring n1 is connected to the source line SL, for example. The source line SL is connected to a source line driver SD through a high-breakdown-voltage transistor 43.

The transistors 41 and 42 are, for example, high-breakdown-voltage field effect transistors. In addition, in this example, the transistors 41 and 42 are N-channel transistors. However, the transistors 41 and 42 may instead be P-channel transistors. In this example, the transistor 41 is an enhancement-type transistor, and the transistor 42 is a depletion-type transistor. In this case, a threshold voltage of the transistor 41 is greater than a threshold voltage of the transistor 42. In addition, a breakdown voltage of the transistor 42 is greater than a breakdown voltage of the transistor 41.

Configuration Example

Figure 3:
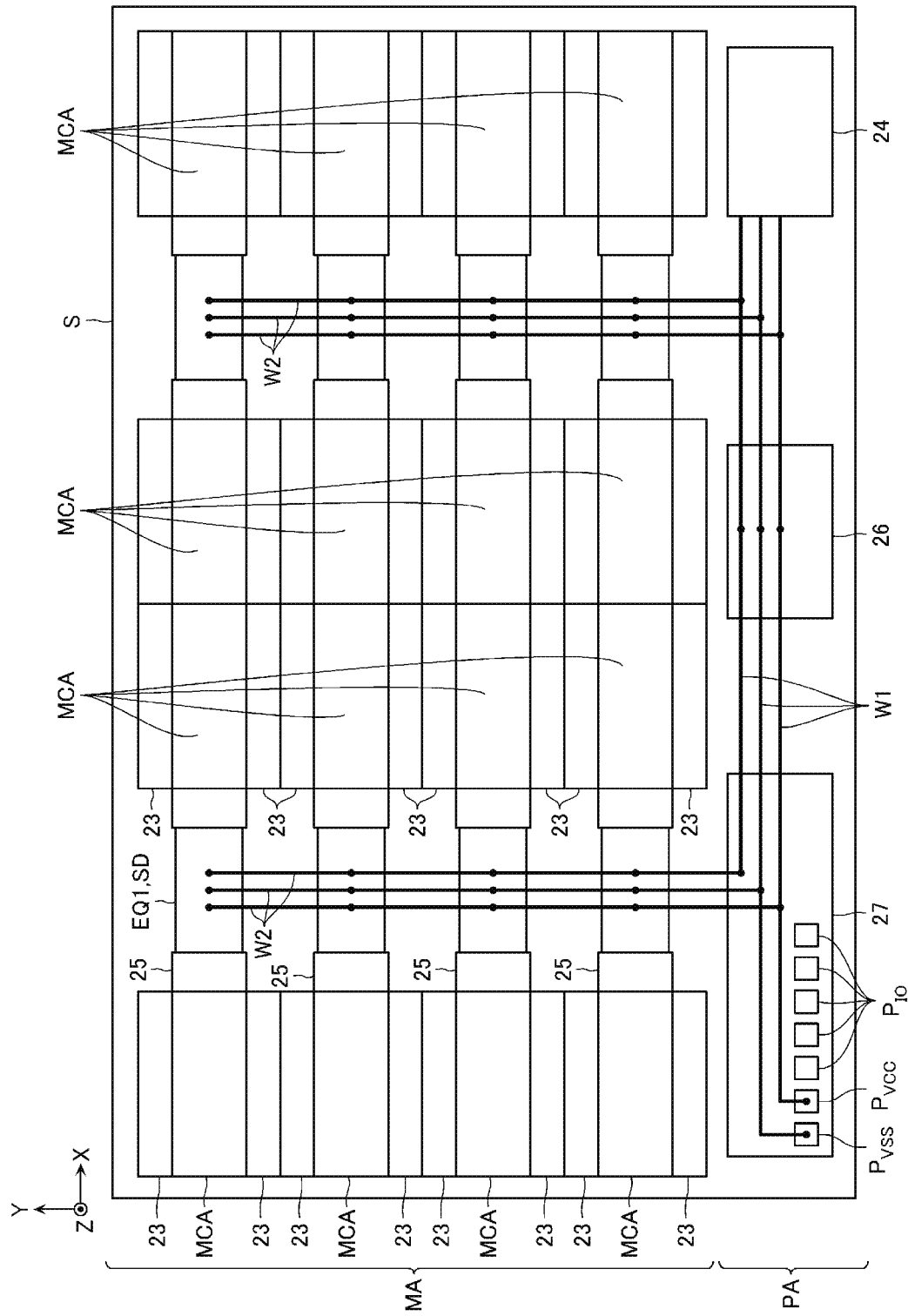
FIG. 3 is a schematic plan view of a semiconductor storage device according to a first embodiment.

FIG. 3 is a schematic plan view showing a configuration example of a semiconductor storage device according to the first embodiment. FIG. 3 illustrates the arrangement of various components on the substrate S. A memory area MA and a peripheral area PA are provided on the substrate S.

The memory area MA in this depiction is sub-divided into a total of 16 smaller areas (sub-divisions) aligned in groups of four along the Y direction and the X direction (a 4×4 arrangement). In each of the 16 smaller areas, a memory cell array MCA, two block selection circuits 23 (see FIG. 1), and a sense amplifier 25 (see FIG. 1) are provided. The two block selection circuits 23 are provided at both sides of the memory cell array MCA in the Y direction. The sense amplifier 25 is provide at one side of the memory cell array MCA in the X direction.

A total of eight smaller regions are further arranged on the substrate S, in a 4×2 arrangement with four regions along the Y direction and two regions along the X direction. In each of these eight small regions, an equalizer circuit EQ1 (see FIG. 2) and a source line driver SD (FIG. 2) are provided. Each of the equalizer circuit EQ1 and the source line driver SD is provided corresponding to two memory cell arrays MCA aligned in the X direction. In addition, the small region may include a part of the sequencer 26 in addition to the equalizer circuit EQ1 and the source line driver SD.

In the peripheral area PA, the voltage selection circuit 24, the sequencer 26, and a pad electrode unit 27 are provided along the X direction. The pad electrode unit 27 includes a plurality of pad electrodes $P_{to}$ used for input and output of user data, address data, and command data, and pad electrodes $P_{VCC}$, $P_{VDD}$ (though not specifically shown), and $P_{VSS}$ used for power supply. A voltage VCC is a power supply voltage supplied to the pad electrode $P_{VCC}$. A voltage VDD less than the voltage VCC is supplied as power supply voltage to the pad electrode $P_{VDD}$. A voltage VSS less than the voltage VDD is supplied to the pad electrode $P_{VSS}$. For example, a voltage of about 0 V (e.g., ground voltage) is supplied to the pad electrode $P_{VSS}$.

In addition, each of the components provided in the memory area MA and the peripheral area PA are connected through a plurality of wirings W1, a plurality of wirings W2, and the like. For example, the plurality of wirings W1 is provided in the peripheral area PA and extends in the X direction. A part of the wiring W1 is connected to, for example, the pad electrode $P_{VCC}$, the pad electrode $P_{VDD}$, or the pad electrode $P_{VSS}$, the voltage selection circuit 24, and the sequencer 26, and transfers power supplied from the pad electrode $P_{VCC}$, the pad electrode $P_{VDD}$, or the pad electrode $P_{VSS}$. A part of the wiring W1 is used as a part of the wiring CG (FIG. 1). The plurality of wirings W2 is provided, for example, in the memory area MA and extends in the Y direction. A part of the wiring W2 is connected to, for example, the wiring W1 and used for transferring power. A part of the wiring W2 is used as a part of the wiring CG (see FIG. 1). In addition, an electric resistance value of the wiring W2 is less than an electric resistance value of the wiring W1.

Figure 4:
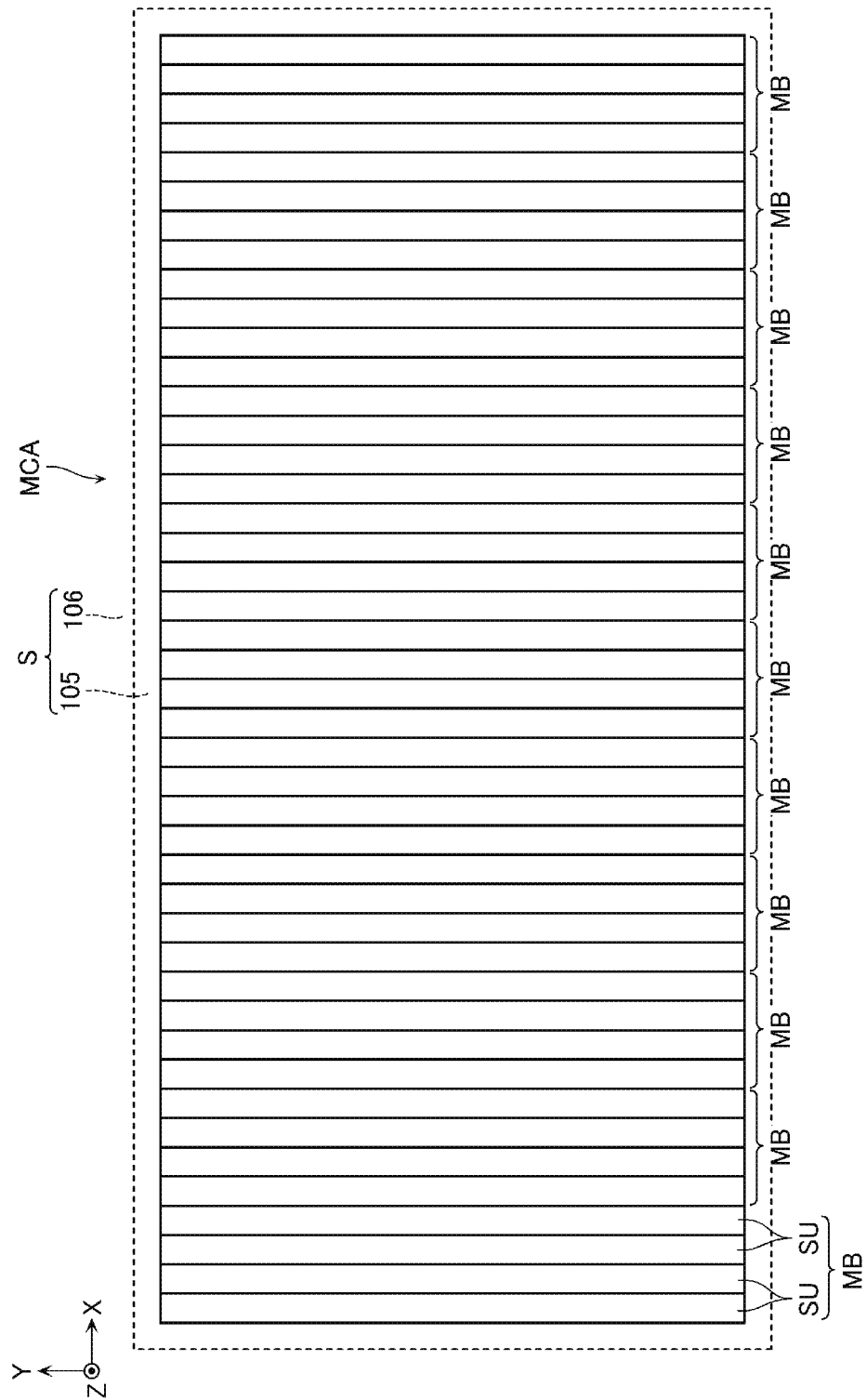
FIG. 4 is an enlarged view of a part of FIG. 3.

FIG. 4 is an enlarged view of a part of FIG. 3. As shown in FIG. 4, each of the memory cell arrays MCA includes a plurality of memory blocks MB spaced along the X direction. In addition, in this example, each of the memory blocks MB includes four string units SU spaced in the X direction.

In addition, as shown in FIG. 4, an N-type well 106 is provided on the substrate S. In addition, a P-type well 105 is provided in an area corresponding to the memory cell array MCA in an area where the N-type well 106 is also provided. Similarly to FIG. 3, when 16 memory cell arrays MCA are provided in the memory area MA, for example, 16 P-type wells 105 are provided in the memory area MA.

Figure 5:
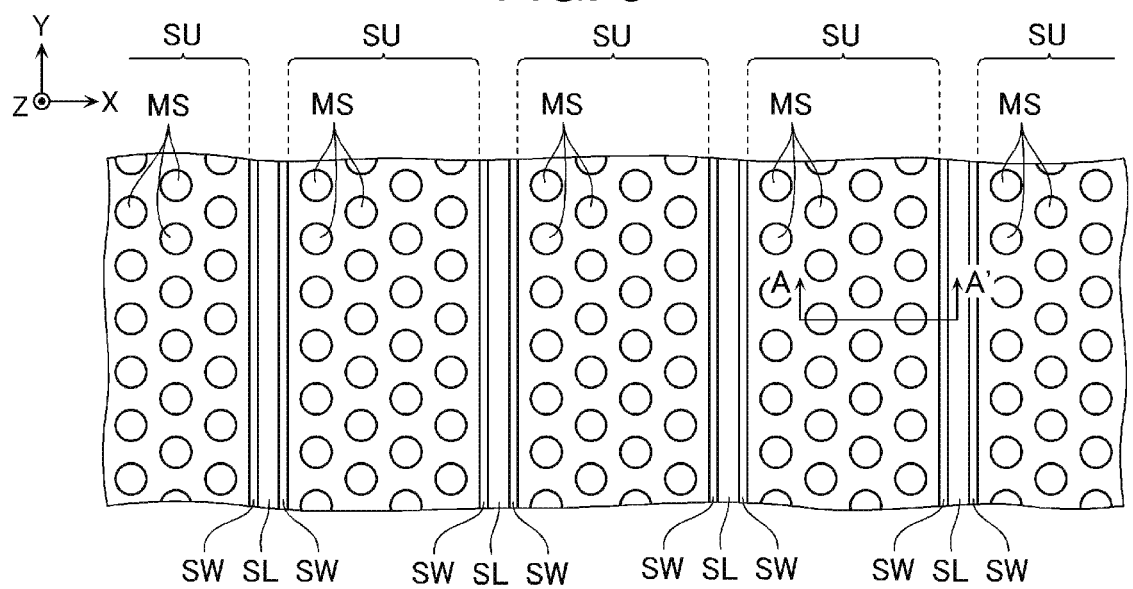
FIG. 5 is an enlarged view of a part of FIG. 4.

FIG. 5 is an enlarged view of a part of FIG. 4. As shown in FIG. 5, each of the string units SU includes a plurality of memory strings MS arranged in a zigzag shape (rows in adjacent columns in the arrangement are offset from one another in the y-direction). In addition, a source line SL is provided between each pair of string units SU adjacent to each other in the X direction. In addition, an insulating layer SW is provided between the source line SL and the string unit SU.

Figure 6:
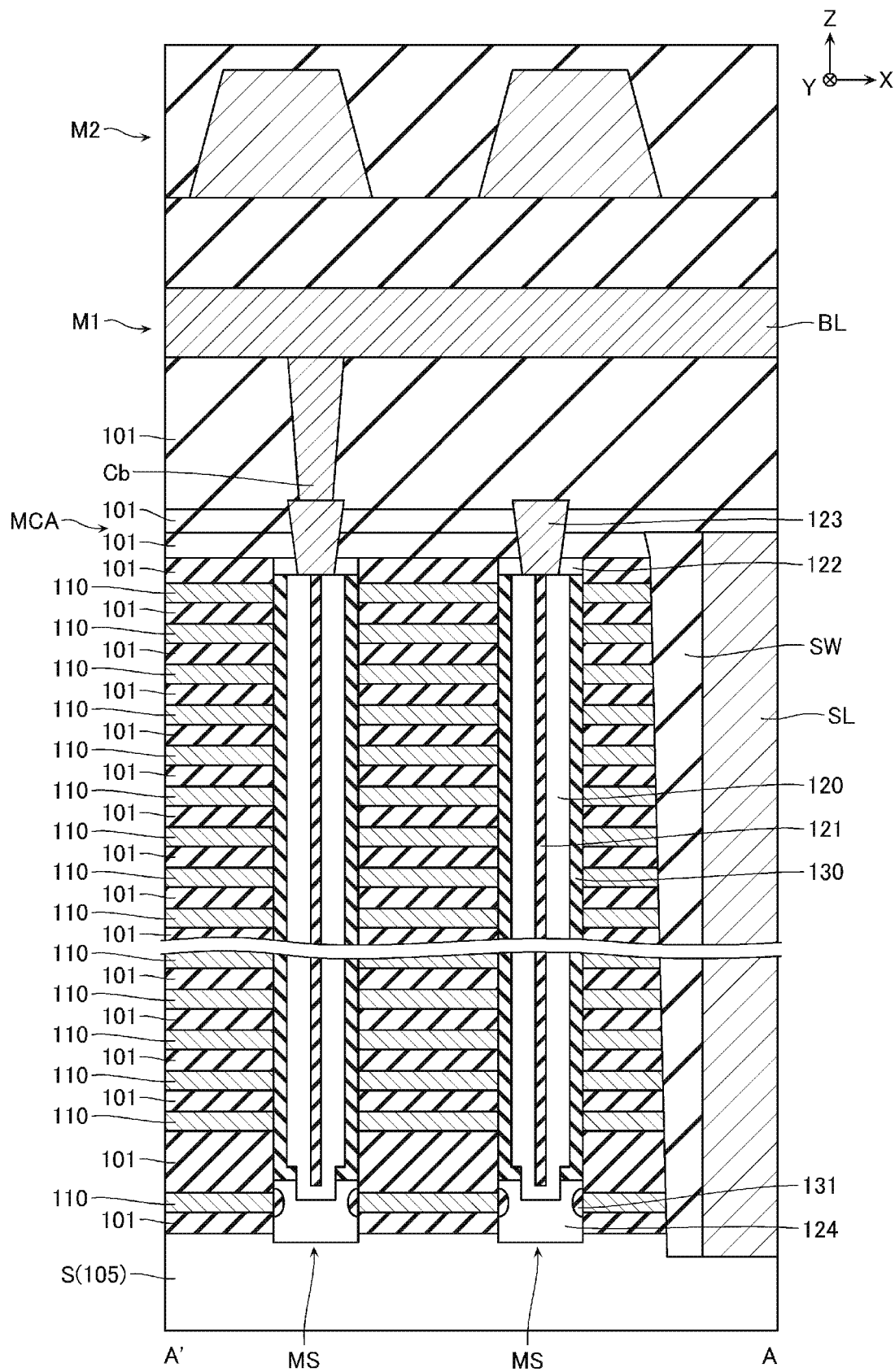
FIG. 6 is a cross-sectional view of the structure shown in FIG. 5 taken along a line A-A'.

FIG. 6 is a cross-sectional view of the structure shown in FIG. 5 taken along a line A-A' and viewed in the direction of the arrows on the line A-A'. In FIG. 6, the substrate S, the memory cell array MCA, a metal wiring layer M1, and a metal wiring layer M2 are shown.

The substrate S is, for example, a semiconductor substrate formed of single crystal silicon (Si) or the like. As described above, the N-type well 106 is provided at the surface of the substrate S. However, in addition, the P-type well 105 is provided on a part of the N-type well 106.

The memory cell array MCA includes a plurality of conductive layers 110 spaced in the Z direction, a plurality of semiconductor layers 120 extending in the Z direction, and a gate insulating film 130 provided between the conductive layers 110 and the semiconductor layers 120.

The conductive layer 110 is, for example, a conductive stacked film including titanium nitride (TiN) and tungsten (W). In addition, an insulating film 101 of silicon oxide (SiO$_2$) or the like is provided between adjacent conductive layers 110 in the Z direction.

One or more conductive layers 110 provided in a lowermost layer among the plurality of conductive layers 110 function as the gate electrodes of the source selection line SGS (FIG. 1) and the source selection transistor STS (FIG. 1). In addition, one or more conductive layers 110 positioned above the lowermost layers function as gate electrodes and the dummy word line DWL (FIG. 1) for the dummy cell(s) DC (FIG. 1). In addition, one or more conductive layers 110 above the dummy cell(s) DC function as the gate electrodes and the word line WL (FIG. 1) of the memory cells MC (FIG. 1). In addition, one or more conductive layers 110 positioned above the memory cells MC function as gate electrodes and the dummy word line DWL (FIG. 1) of another dummy cell(s) DC (FIG. 1). In addition, one or more conductive layers 110 provided above the uppermost dummy cell(s) DC function as gate electrodes and the drain selection line SGD (FIG. 1) for the drain selection transistor (s) STD (FIG. 1).

The semiconductor layer 120 is, for example, a cylindrical semiconductor pillar/column including polycrystalline silicon (Si). The semiconductor layer 120 functions as a channel region of the drain selection transistor STD, the dummy cells DC, the memory cells MC, and the source selection transistor STS. A core insulating layer 121 of silicon oxide or the like is provided in a central portion of the semiconductor layer 120. A cap semiconductor layer 122 including polycrystalline silicon and an N-type impurity such as phosphorus (P) is provided at an upper end of the semiconductor layer 120. A contact electrode 123 extending in the Z direction is provided in the cap semiconductor layer 122. A semiconductor layer 124 of single crystal silicon or the like is provided at a lower end of the semiconductor layer 120. The semiconductor layer 124 functions as a part of the channel region of the source selection transistor STS. The lower end of the semiconductor layer 124 is connected to the P-type well 105 of the substrate S. In addition, the source line SL is also connected to the P-type well 105 of the substrate S.

The gate insulating film 130 is an insulating stacked film including, for example, a tunnel insulating film of silicon oxide or the like, a charge storage film of silicon nitride (Si$_3$N$_4$) or the like, and a block insulating film of silicon oxide or the like. However, the gate insulating film 130 may not include a charge storage film but may include a floating gate including polycrystalline silicon or the like. In addition, a gate insulating film 131 of silicon oxide or the like is provided between the semiconductor layer 124 and the lowermost conductive layer 110.

The metal wiring layer M1 includes a plurality of wirings. These wirings are, for example, a conductive stacked film including titanium nitride and copper (Cu). The wirings in the metal wiring layer M1 are used, for example, as a part of the bit lines BL (FIG. 1) and the wirings W1 (FIG. 3). The bit lines BL are connected to a contact electrode 123 through the contact electrode Cb.

The metal wiring layer M2 includes a plurality of wirings. These wirings are, for example, a conductive stacked film including titanium nitride and aluminum (Al). The plurality of wirings in the metal wiring layer M2 are used, for example, as a part of the pad electrodes P$_{VCC}$, P$_{VDD}$, P$_{VSS}$, and the wirings W1, and the wirings W2. In addition, an electric resistance value of the wirings in the metal wiring layer M2 is less than an electric resistance value of the wirings in the metal wiring layer M1 on a ohms per square basis.

Erasing Operation

Figure 7:
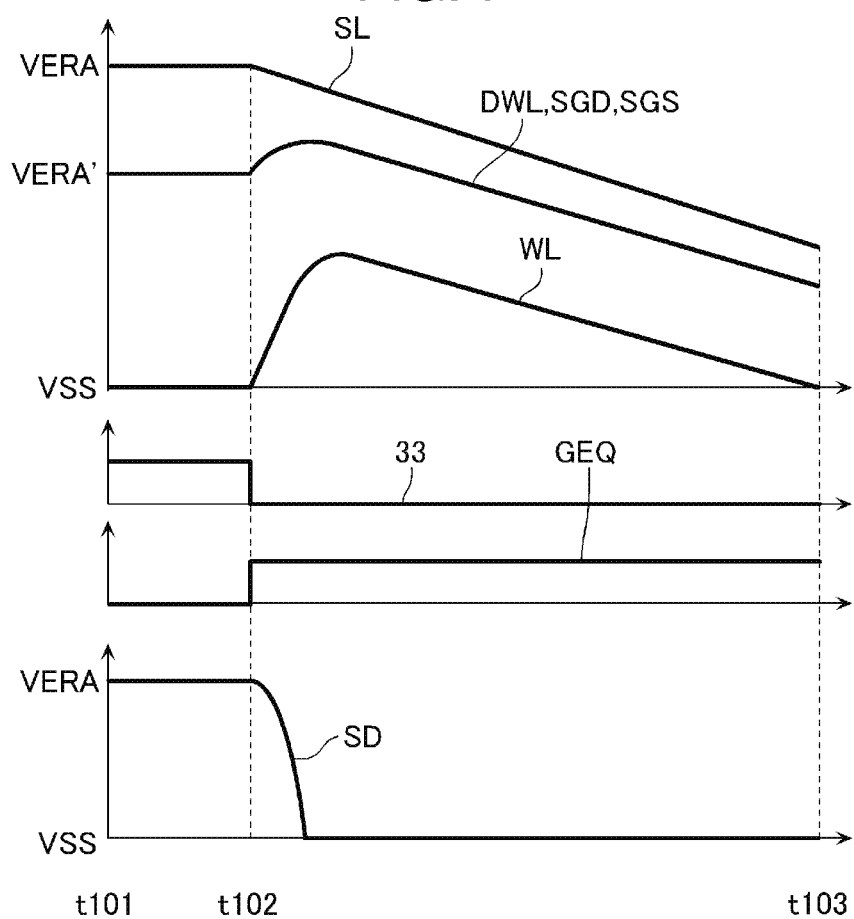
FIG. 7 is a waveform diagram illustrating an erasing operation performed on a semiconductor storage device according to a first embodiment.
Figure 8:
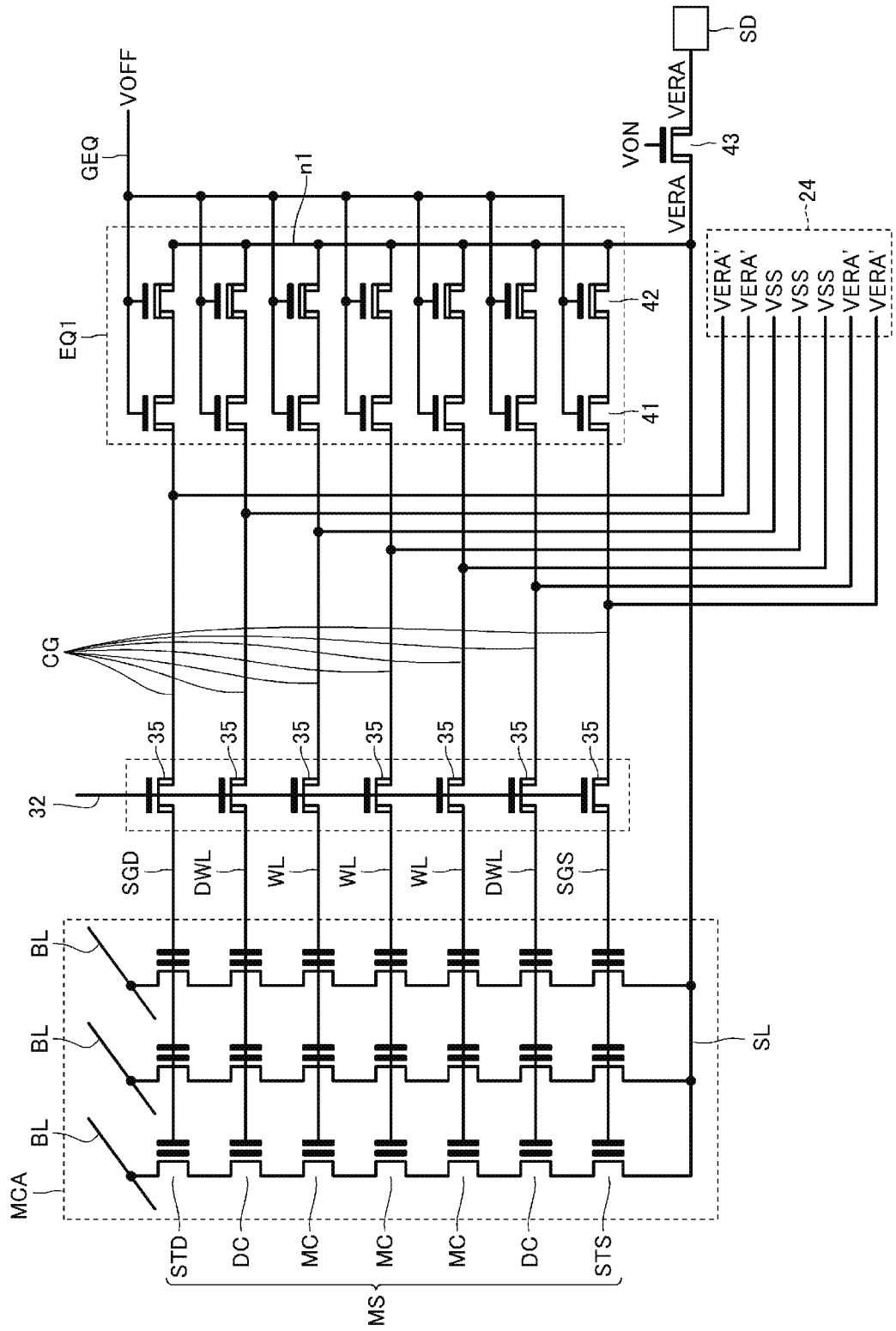
FIGS. 8 and 9 are each a circuit diagram illustrating different states of a semiconductor storage device of a first embodiment during the erasing operation.
Figure 9:
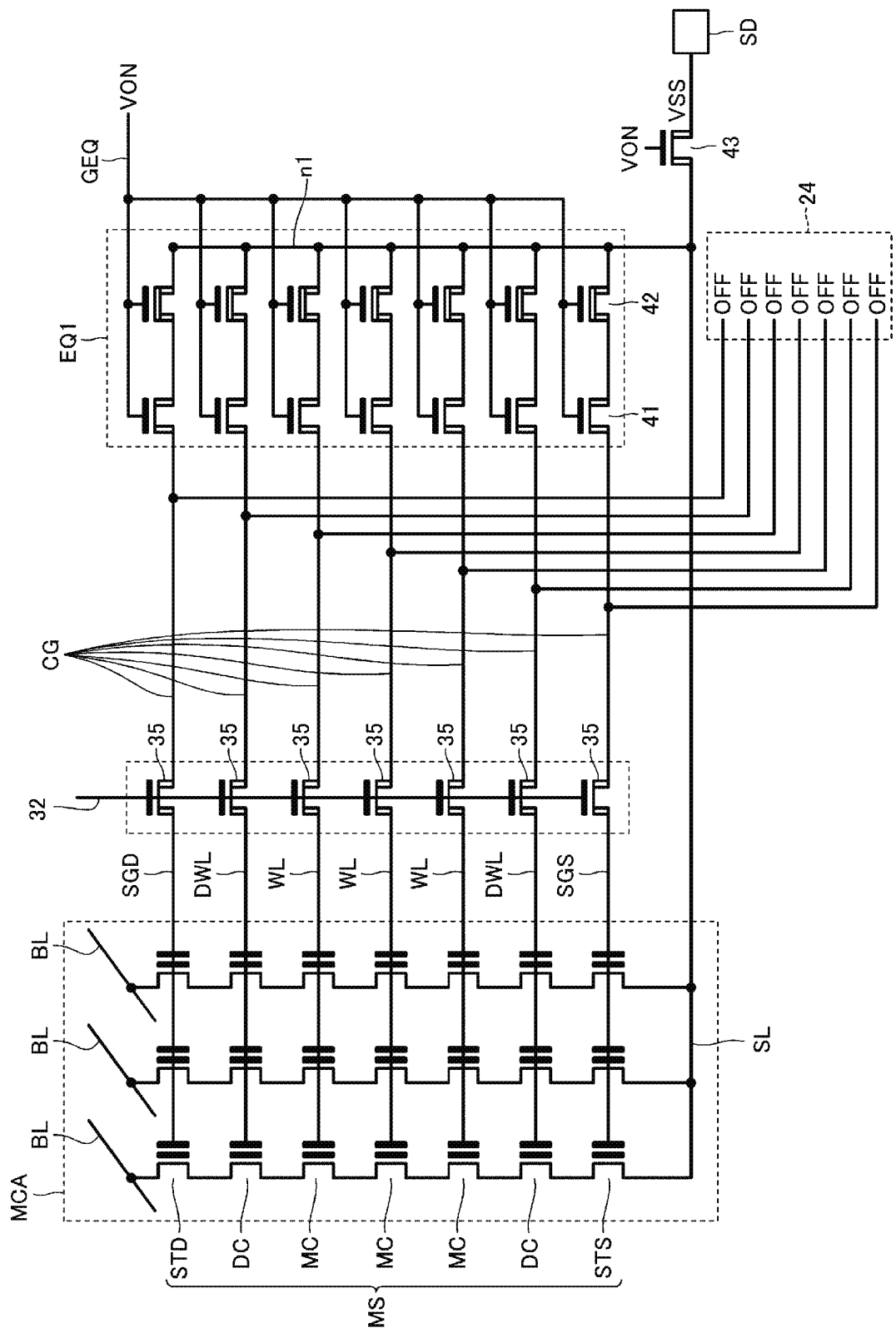

Next, the erasing operation of the semiconductor storage device according to the first embodiment will be described with reference to FIGS. 7 to 9. FIG. 7 is a waveform diagram showing voltages applied in the erasing operation. FIGS. 8 and 9 are circuit diagrams showing voltages applied in the erasing operation shown in FIG. 7 at time t101 to t102 and time t102 to t103, respectively.

At time t101 to t102 of FIG. 7, a voltage is supplied to the memory cell array MCA to erase the user data stored in the memory cell MC.

For example, at time t101 to t102, the voltage VSS is applied to the word line WL, a voltage VERA is applied to the source line SL, and a voltage VERA' is applied to the dummy word line DWL and the selection gate lines (SGD, SGS). The voltage VSS is, for example, a voltage of about 0V. The voltage VERA is a voltage greater than the voltage VSS and is, for example, a voltage of about 20 V. The voltage VERA' is a voltage with a magnitude between that of the voltage VSS and the voltage VERA, and is, for example, a voltage of about 15V.

By applying such voltages, a channel of holes is formed on an outer peripheral surface of the semiconductor layer 120 (FIG. 6), and the channel of each transistor in the memory string MS is electrically connected to the P-type well 105 on the surface of the substrate S. In addition, electrons in the charge storage film in the gate insulating film 130 are extracted to the channel.

In addition, as shown in FIG. 8, applying the voltages to the word lines WL, the dummy word line DWL, and the selection gate lines (SGD, SGS) is performed through the voltage selection circuit 24. That is, the voltage VSS is output to a first operating voltage output terminal 31 among the plurality of operating voltage output terminals 31 of the operating voltage generation circuit 21 (FIG. 1). The voltage VERA' is generated by the operating voltage generation circuit 21 and is output to a second operating voltage output terminal 31. The selected block selection line 32 and voltage selection line 33 are set to the "H" state, and the block selection transistor 35 in the block selection circuit 23 and the voltage selection transistor 37 in the voltage selection circuit 24 are set to the ON state. The wiring CG corresponding to the word line WL is caused to be electrically connected to the first operating voltage output terminal 31 and the wiring CG corresponding to the dummy word line DWL and the selection gate lines (SGD, SGS) is caused to be electrically connected to the second operating voltage output terminal 31.

As shown in FIG. 8, applying the voltage to the source line SL is performed by the source line driver SD. That is, the voltage VERA is output from the source line driver SD, a voltage VON is applied to the gate electrode of the transistor 43 so that the transistor 43 is in the ON state, and thus the voltage VERA is transferred to the source line SL.

In addition, at this time, the voltage VOFF is applied to the wiring GEQ. Therefore, the plurality of transistors 41 and the plurality of transistors 42 in the equalizer circuit EQ1 are in the OFF state.

At time t102 to t103 of FIG. 7, a recovery operation for discharging the source line SL or the like is executed.

For example, at the time t102 to t103, as shown in FIGS. 7 and 9, the voltage selection line 33 is set to the "L" state, all the voltage selection transistors 37 in the voltage selection circuit 24 are set to the OFF state, and the wiring CG is disconnected from the operating voltage output terminal 31 of the operating voltage generation circuit 21. The voltage VSS is output from the source line driver SD, the voltage VON is applied to the gate electrode of the transistor 43 so that the transistor 43 is in the ON state, and thus the voltage VSS is applied to the source line SL. The voltage VON is applied to the wiring GEQ at this time. Therefore, the transistors 41 and the transistors 42 in the equalizer circuit EQ1 are in the ON state, and wirings CG are electrically connected to the source line SL. In some examples, the voltage VERA may be applied to the wiring GEQ. The voltage applied to the gate electrode of the transistor 43 may be less than the voltage VERA. In other examples, the voltage output from the source line driver SD may be the voltage VDD or the voltage VCC rather than the voltage VSS.

When such voltages are applied, as shown in FIG. 7, the voltage of the source line SL is gradually reduced. This is because the charges in the source line SL are discharged through the transistor 43 and the source line driver SD.

The voltages of the word line WL, the dummy word line DWL, and the selection gate lines (SGD, SGS) gradually increase initially (from time t102). This is because the charges in the source line SL also flow into the word line WL, the dummy word line DWL, and the selection gate line (SGD, SGS) via the equalizer circuit EQ1. Since a voltage difference between the word line WL and the source line SL is initially large, the voltage of the word line WL increases relatively rapidly and substantially. On the other hand, since the voltage difference between the dummy word line DWL and the selection gate lines (SGD, SGS), and the source line SL is relatively smaller, the voltages of such lines increase less abruptly and substantially.

After some time has elapsed from time t102, the voltages of the word line WL, the dummy word line DWL, and the selection gate lines (SGD, SGS) start to be gradually reduced. This is because the voltage differences between the word line WL, the dummy word line DWL, and the selection gate lines (SGD, SGS), and the source line SL become relatively small, and the charges in the word line WL, the dummy word line DWL, and the selection gate lines (SGD, SGS) are also being discharged through the transistor 43 and the source line driver SD.

Here, the voltage of the word line WL is equal to or less than the voltages of the dummy word line DWL and the selection gate lines (SGD, SGS). In addition, the voltages of the dummy word line DWL and the selection gate lines (SGD, SGS) are generally less than the voltage of the source line SL.

The times for which the voltages of the word line WL, the dummy word line DWL, and the selection gate lines (SGD, SGS) continue to increase may be different depending on the wiring utilized. In general, the time over which the voltage increases tends to be shorter than the time over which the voltage decreases for each wiring.

Effects

Next, the effects of the semiconductor storage device according to the first embodiment will be described.

To provide a semiconductor storage device operating at high speed, it is desirable to shorten the time required for the recovery operation (illustrated as the time t102 to t103 in FIG. 7). To this end, it is desirable to discharge the charge of the source line SL at high speed to reduce the voltage of the source line SL at high speed. However, when the voltage of the source line SL is rapidly reduced, the voltages of the word line WL and other lines may also be reduced due to capacitive coupling. Here, as illustrated in FIG. 7, at the time t101 to t102, since the voltage of about 0 V is being applied to the word line WL, when the voltage of the word line WL is reduced, the voltage of the word line WL may become a negative voltage in some cases. In such a case, problems may occur in the block selection transistor 35 and the like.

Here, the semiconductor storage device according to the embodiment includes the equalizer circuit EQ1 as described with reference to FIG. 2. In addition, the equalizer circuit EQ1 includes the transistors 41 and 42 connected to the word line WL and the source line SL. According to such a configuration, as described with reference to FIG. 7, it is possible to charge the word line WL and the like with the charge of the source line SL. Therefore, it is possible to prevent the reduction of the voltage of the word line WL when the voltage of the source line SL is reduced at high speed. Thus, it is possible to shorten the time required for the recovery operation without causing problems or the like in the block selection transistor 35 and the like.

In the embodiment, as described with reference to FIG. 2, the equalizer circuit EQ1 includes the enhancement-type transistor 41 and the depletion-type transistor 42 connected between the wiring CG and the source line SL. Here, as described above, the threshold voltage of the transistor 41 is greater than the threshold voltage of the transistor 42. Therefore, it is possible to suitably prevent a leakage current between the word line WL and the source line SL by the transistor 41. In addition, a breakdown voltage of the transistor 42 is greater than a breakdown voltage of the transistor 41. Therefore, it is possible to improve the breakdown voltage by the transistor 42.

In the embodiment, as described with reference to FIG. 3, the memory area MA is divided into a plurality of small areas. In the memory area MA, a plurality of equalizer circuits EQ1 provided corresponding to the plurality of small areas are provided. According to such a configuration, for example, it is possible to preferably charge the word line WL and the like in comparison with a case in which the equalizer circuit EQ1 is provided in the peripheral area PA. This is because it is possible to shorten the current path connecting the word line WL and the like with the source line SL and the like through the equalizer circuit EQ1, and it is possible to reduce the electric resistance value of such current path.

Second Embodiment

Next, a semiconductor storage device according to a second embodiment will now be described with reference to FIGS. 10 and 11. In the following description, the same reference numerals as those in the first embodiment are given to the same parts as those in the first embodiment, and the description thereof will be omitted.

The semiconductor storage device according to the second embodiment is basically configured similarly to the semiconductor storage device according to the first embodiment.

An operation at time t201 to t202 of the erasing operation according to the second embodiment is performed similarly to the operation (FIGS. 7 and 8) at the time t101 to t102 of the erasing operation according to the first embodiment.

An operation at time t202 to t203 is performed substantially similarly to the operation at the time t102 to t103 of the erasing operation (FIGS. 7 and 9) according to the first embodiment. However, at the time t202 to t203, as shown in FIGS. 10 and 11, the voltage supplied from the source line driver SD is maintained at VERA. In addition, the voltage VERA is continuously supplied to the source line SL through the transistor 43. Therefore, as shown in FIG. 10, the charge of the word line WL, the dummy word line DWL, and the selection gate lines (SGD, SGS) is started, on the other hand, the discharge of the source line SL is not yet performed.

An operation at time t203 to t204 is performed similarly to the operation at the time t101 to t102 of the erasing operation (FIGS. 7 and 9) according to the first embodiment. Therefore, the discharge of the source line SL is performed.

According to such a method, it is possible to charge the word line WL and the like in advance, before the discharge of the source line SL, is started. Therefore, in comparison with the first embodiment, it is possible better prevent the problems of the block selection transistor 35 and the like.

Figure 10:
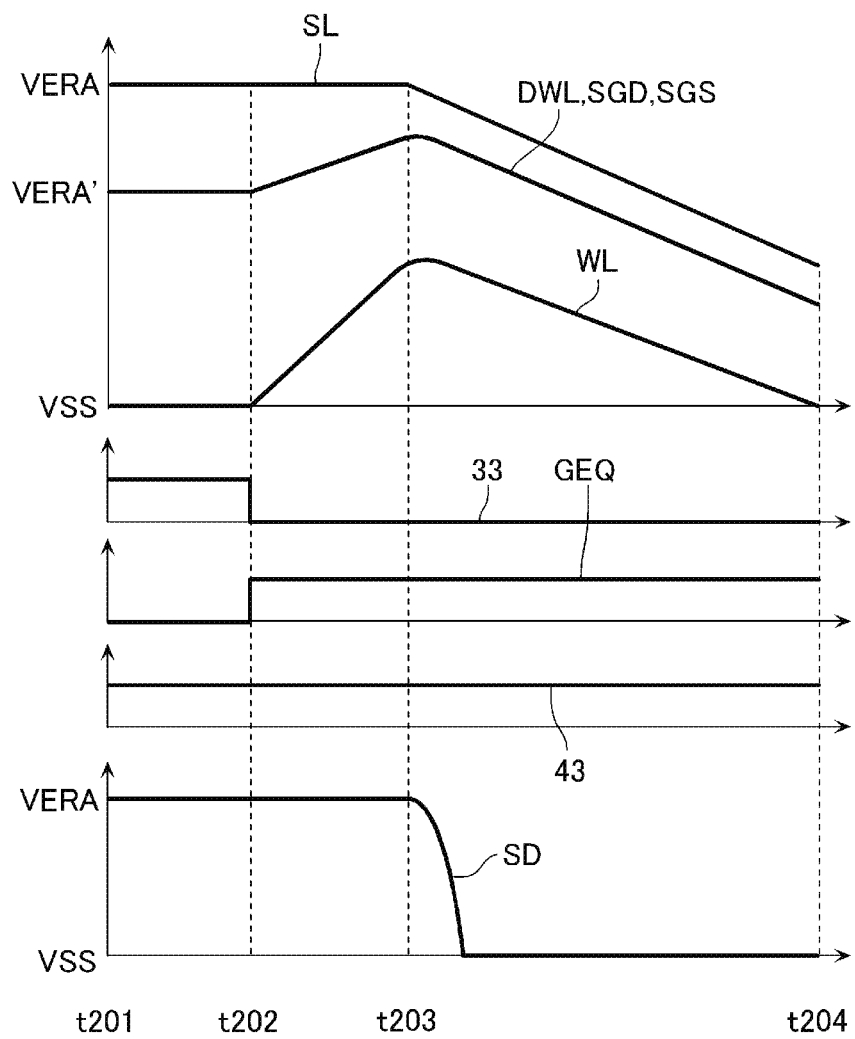
FIG. 10 is a waveform diagram illustrating an erasing operation performed on a semiconductor storage device according to a second embodiment.
Figure 11:
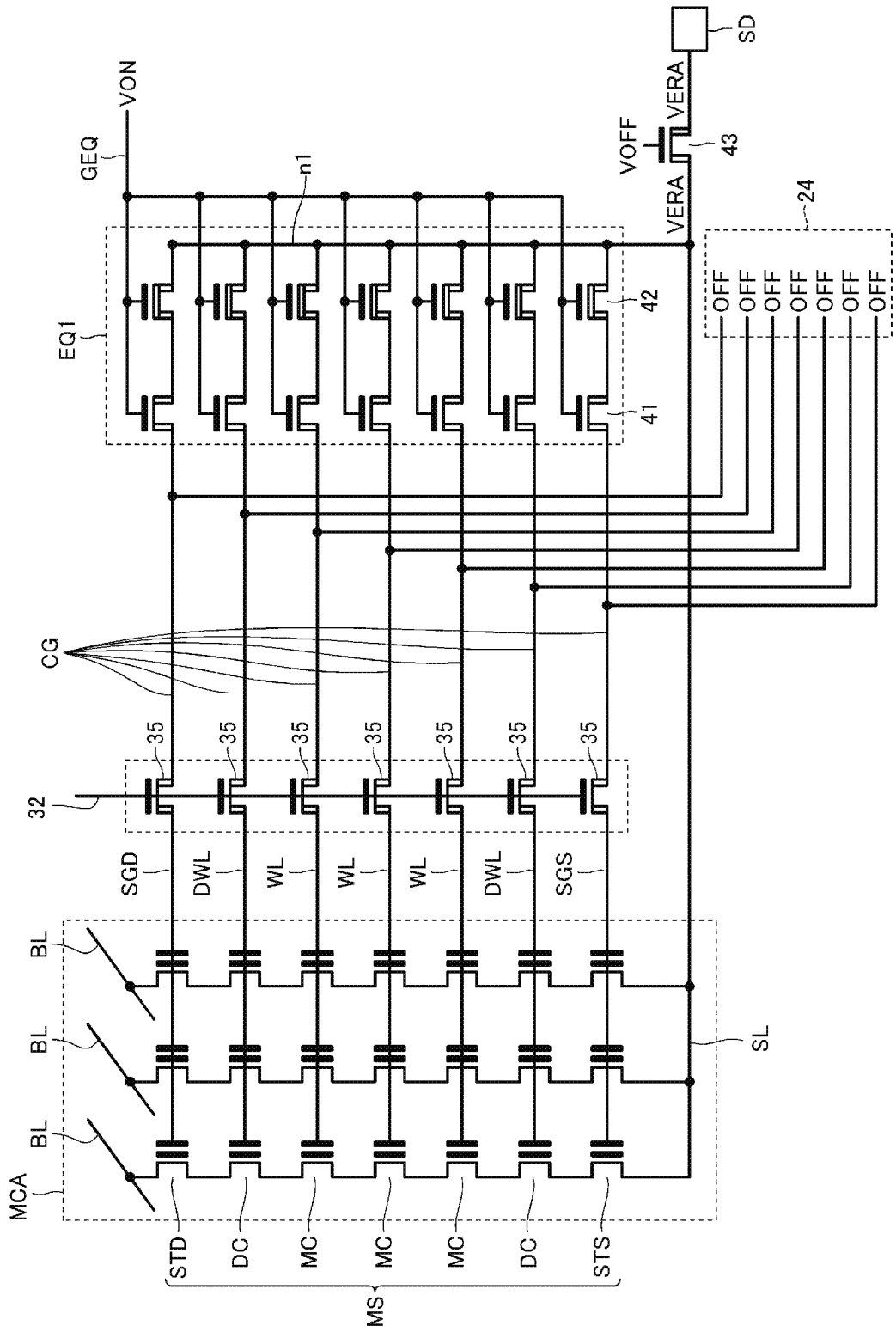
FIG. 11 is a circuit diagram illustrating a state of the semiconductor storage device during the erasing operation.

In FIG. 10, the discharge of the source line SL is started at the timing t203 before the voltages of the word line WL, the dummy word line DWL, and the selection gate lines (SGD, SGS) are saturated. According to this aspect, it is possible to relatively shorten the time required for the recovery operation.

However, for example, it is also possible to saturate the voltages of the word line WL, the dummy word line DWL, and the selection gate lines (SGD, SGS) during the time t202 to t203. In such a case, the voltages of the word line WL, the dummy word line DWL, and the selection gate lines (SGD, SGS) increase to about VERA. In such a case, it is also conceivable that the voltages of the word line WL, the dummy word line DWL, and the selection gate lines (SGD, SGS) exceed the voltage of the source line SL at the time t203 and the time t204.

Third Embodiment

Next, a semiconductor storage device according to a third embodiment will now be described with reference to FIGS. 12 to 15. In the following description, the same reference numerals as those in the first embodiment are given to the same parts as those in the first embodiment, and the description thereof will be omitted.

Figure 12:
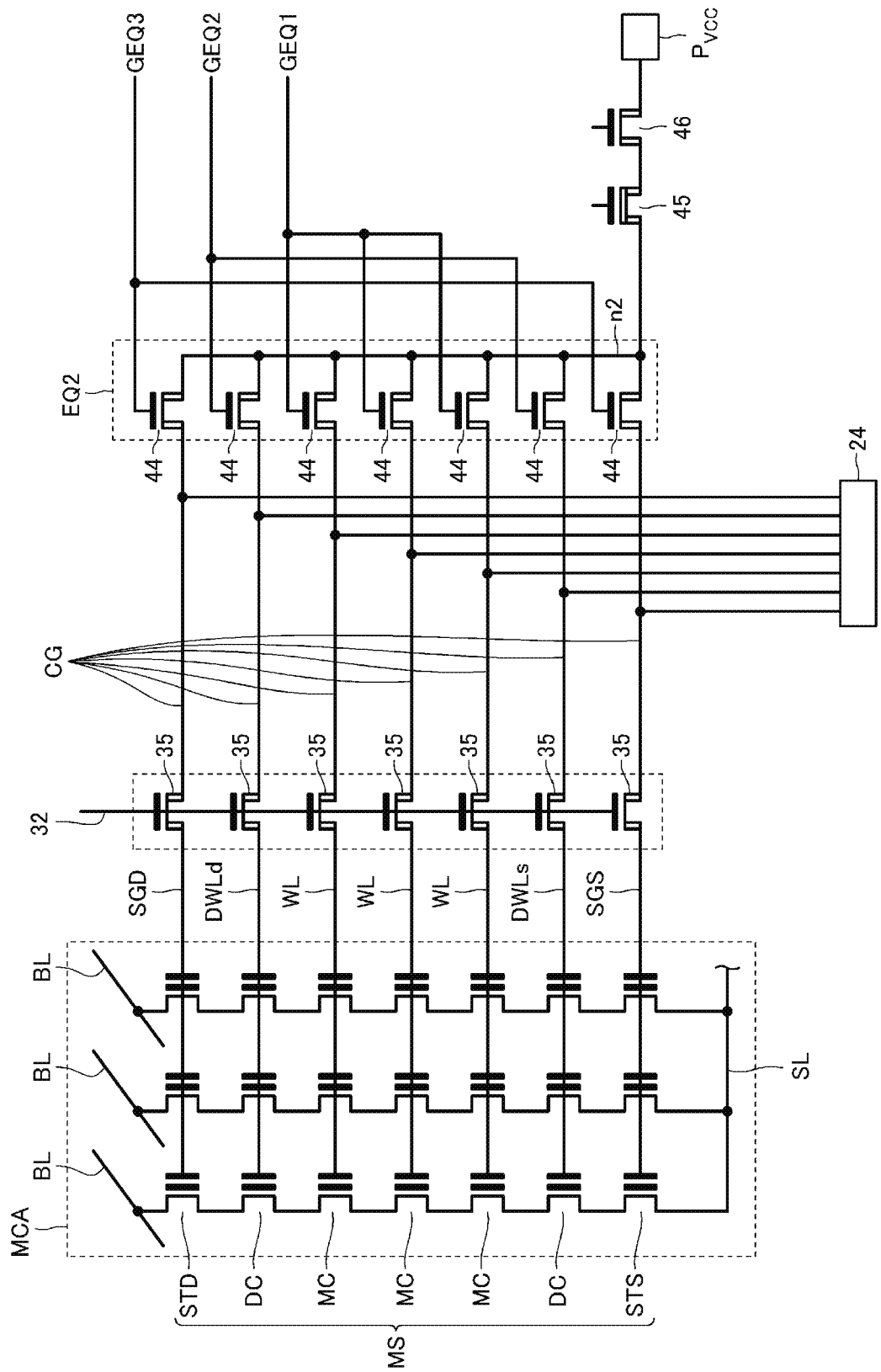
FIG. 12 is a schematic equivalent circuit diagram showing a configuration of a part of a semiconductor storage device according to a third embodiment.

The semiconductor storage device according to the third embodiment is configured similarly to the semiconductor storage device according to the first embodiment. However, as shown in FIG. 12, the semiconductor storage device according to the third embodiment includes an equalizer circuit EQ2 rather than the equalizer circuit EQ1 (compare FIG. 2). The equalizer circuit EQ2 is arranged similarly to the equalizer circuit EQ1. That is, as illustrated with reference to FIG. 3, a plurality of equalizer circuits EQ2 are arranged in the memory area MA between two memory cell arrays MCA adjacent in the X direction. In FIG. 12, among the dummy word lines DWL, a dummy word line positioned between the drain selection line SGD and the word line WL is denoted by a reference numeral "DWLd". Similarly, dummy word lines DWL positioned between the source selection line SGS and the word line WL are denoted by a reference symbol "DWLs".

The equalizer circuit EQ2 includes a plurality of transistors 44 respectively connected to the plurality of wirings CG and a wiring n2 connected in common to the plurality of transistors 44. The transistor 44 is, for example, a high-breakdown-voltage field effect transistor and is an enhancement-type transistor. In addition, a common wiring GEQ1 is connected to gate electrodes of those transistors 44 corresponding to the word line WL. A common wiring GEQ2 is connected to the gate electrodes of those transistors 44 corresponding to the dummy word lines DWLd and DWLs. A common wiring GEQ3 is connected to the gate electrodes of those transistors 44 corresponding to the selection gate lines (SGD, SGS).

The wiring n2 is connected to the pad electrode $P_{VCC}$ through transistors 45 and 46. The transistors 45 and 46 are, for example, high-breakdown-voltage field effect transistors. In addition, the transistors 45 and 46 are, for example, N-channel transistors. In this example, the transistor 45 is a depletion-type transistor, and the transistor 46 is an enhancement-type transistor.

Erasing Operation

Figure 13:
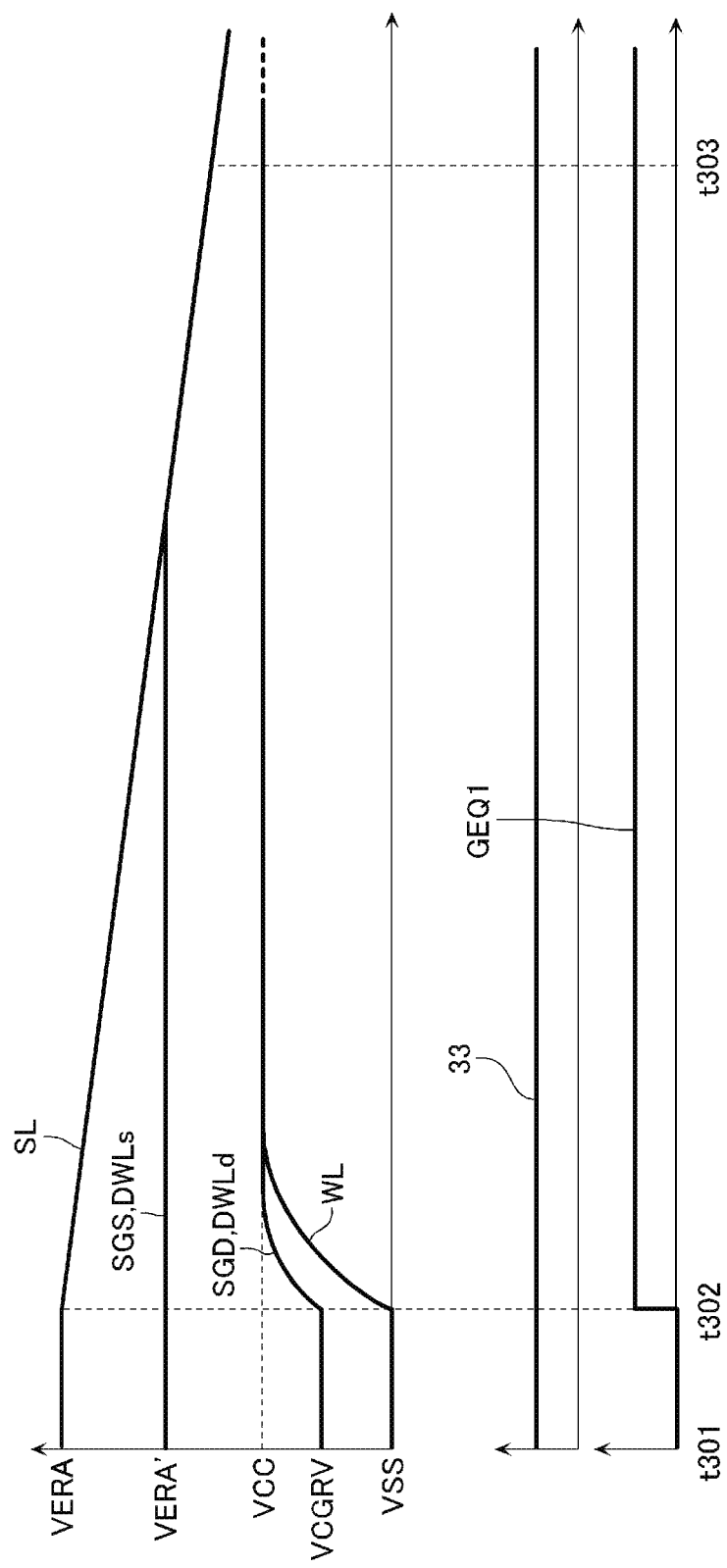
FIG. 13 is a waveform diagram illustrating an erasing operation performed on a semiconductor storage device according to a third embodiment.
Figure 14:
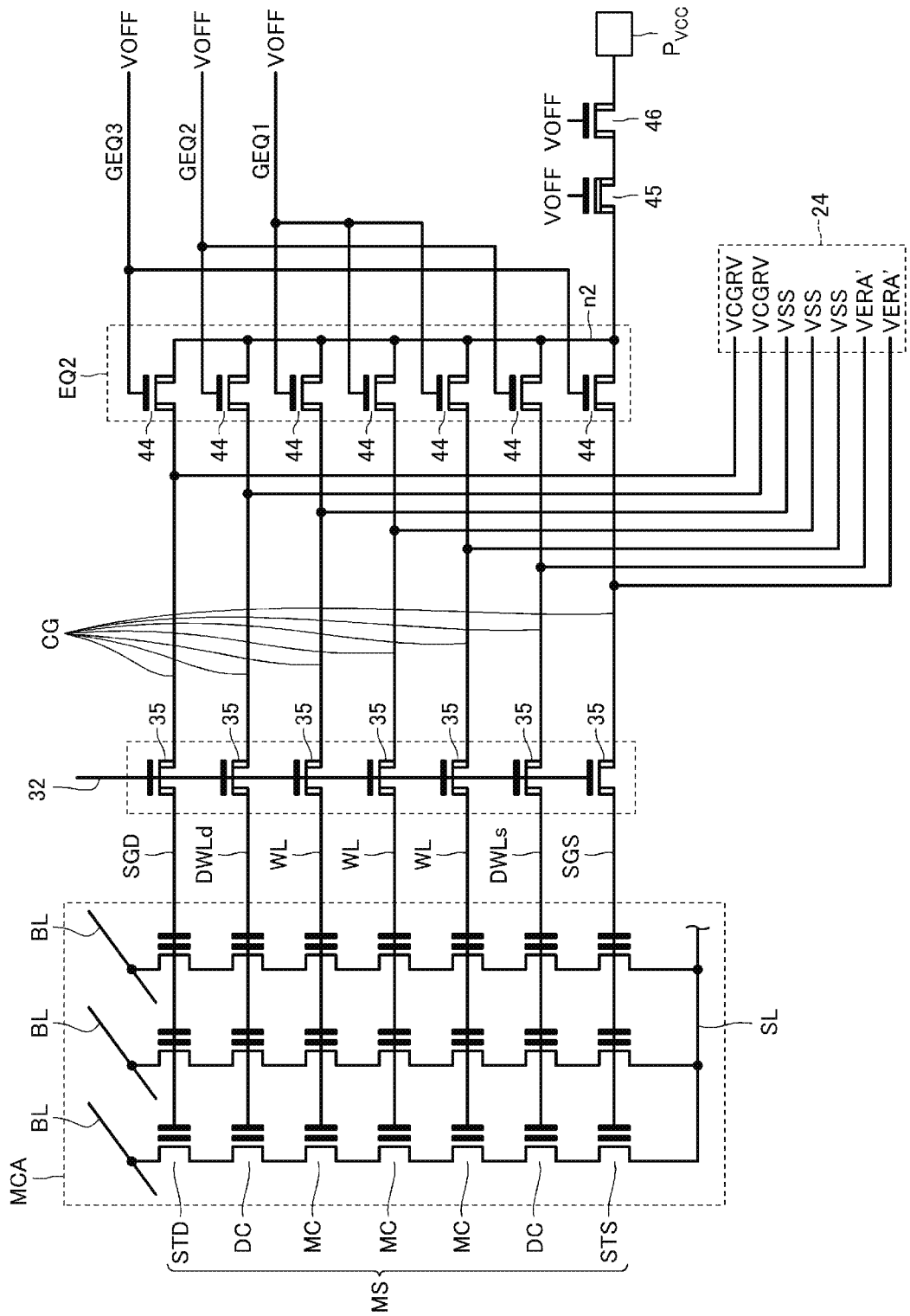
FIGS. 14 and 15 are each a circuit diagram illustrating different states of the semiconductor storage device during same erasing operation.
Figure 15:
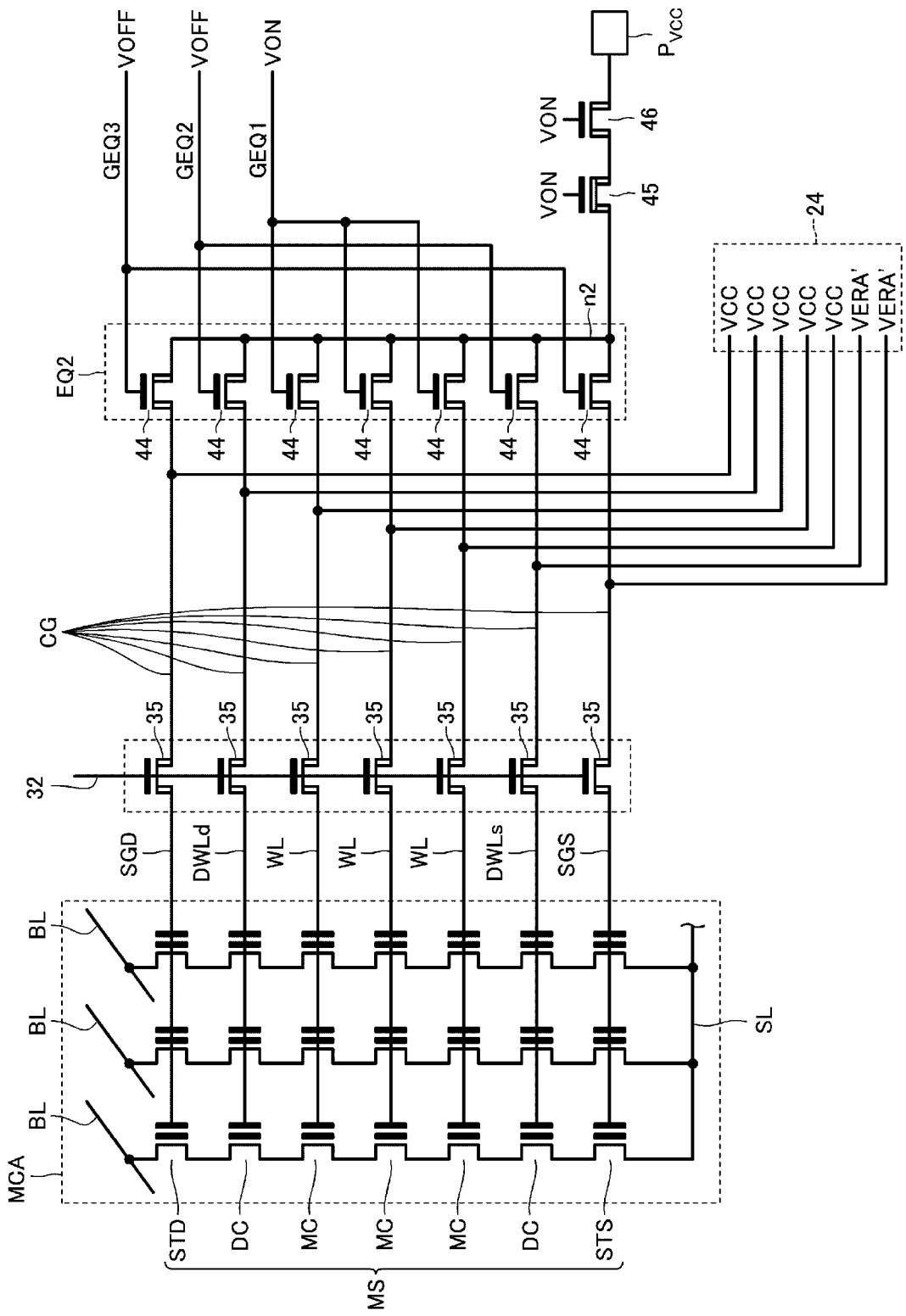

Next, the erasing operation of the semiconductor storage device according to the third embodiment will be described with reference to FIGS. 13 to 15. FIG. 13 is a waveform diagram showing voltages of the word line WL and the like in the erasing operation. FIGS. 14 and 15 are circuit diagrams showing voltages applied in the erasing operation. In addition, FIGS. 14 and 15 correspond to time t301 to t302 and time t302 to t303 shown in FIG. 13, respectively.

At the time t301 to t302 of FIG. 13, a voltage is supplied to the memory cell array MCA to erase the user data stored in the memory cell MC.

For example, at the time t301 to t302, the voltage VSS is applied to the word line WL, the voltage VERA is applied to the source line SL, the voltage VERA' is applied to the source selection line SGS and the dummy word line DWLs, and a voltage VCGRV is applied to the drain selection line SGD and the dummy word DWLd. The voltage VCGRV is a voltage having a magnitude between the voltage VSS and the voltage VCC.

As shown in FIG. 14, applying the voltages to the word lines WL, the dummy word lines DWLd and DWLs, and the selection gate lines (SGD and SGS) is performed through the voltage selection circuit 24. In addition, although not shown, applying the voltage to the source line SL is performed through the source line driver SD. In addition, at this time, a voltage VOFF is applied to the wirings GEQ1, GEQ2, and GEQ3, and the gate electrodes of the transistors 45 and 46.

At the time t302 to t303 of FIG. 13, a recovery operation for discharging the source line SL or the like is executed.

For example, at the time t302 to t303, as shown in FIG. 15, the voltage VCC is applied to the word line WL, the drain selection line SGD, and the dummy word line DWLd through the voltage selection circuit 24, and the voltage VERA' is applied to the source selection line SGS and the dummy word line DWLs. In addition, although not shown, the voltage VCC is applied to the source line SL through the source line driver SD. In addition, the voltage VON is applied to the wiring GEQ1 and the gate electrodes of the transistors 45 and 46, and the voltage VOFF is applied to the wirings GEQ2 and GEQ3.

When such voltages are applied, as shown in FIG. 13, the voltage of the source line SL is gradually reduced. This is because the charges in the source line SL are discharged through the transistor 43 and the source line driver SD.

In addition, the voltages of the word line WL, the drain selection line SGD, and the dummy word line DWLd increase, and are saturated to about the magnitude of the voltage VCC. This is because such lines are charged through the equalizer circuit EQ2 and the voltage selection circuit 24.

The voltages of the source selection line SGS and the dummy word line DWLs are maintained at the voltage VERA' for a fixed time. When the discharge of the source line SL proceeds and the voltage of the source line SL becomes smaller than the voltage VERA', the voltages of the source selection line SGS and the dummy word line DWLs also start to be reduced together with the voltage of the source line SL.

Similarly to the first embodiment, FIG. 13 shows an example in which the discharge of the source line SL and the charging of the word line WL are simultaneously started. However, similarly to the second embodiment, in the third embodiment the discharging of the source line SL may be started after the charging of the word line WL is started.

Effects

Next, the effects of the semiconductor storage device according to the third embodiment will be described.

As described above, to provide a semiconductor storage device operating at high speed, it is desirable to reduce the voltage of the source line SL at high speed. However, when the voltage of the source line SL is reduced at high speed, the voltages of the word line WL and other lines may also be reduced due to capacitive coupling and the voltage of the word line WL may become a negative voltage.

In order to prevent the voltage of the word line WL becoming a negative voltage, it is possible to supply a voltage to the word line WL through the voltage selection circuit 24. However, an electrical resistance value for the current path between the voltage selection circuit 24 and the word line WL may be relatively large. For example, as described with reference to FIG. 3, when the plurality of memory cell arrays MCA and the voltage selection circuit 24 are connected through the portions of wiring W1 and the wiring W2, a wiring length from the memory cell array MCA to the voltage selection circuit 24 may be relatively long. In addition, as described above, the electrical resistance value of the wiring W1 is greater than the electrical resistance value of the wiring W2.

In such a case, even though the word line WL is charged through the voltage selection circuit 24 at the same time as the discharge of the source line SL, the speed of the discharge of the source line SL greatly exceeds the speed of the charging of the word line WL and the voltage of the word line WL may become a negative voltage due to the influence of capacitive coupling.

Therefore, in this embodiment, as described with reference to FIG. 15, the word line WL is charged using the equalizer circuit EQ2. As described above, since the equalizer circuit EQ2 is disposed near the memory cell array MCA, the charging through the equalizer circuit EQ2 is able to be performed faster than the charging through the voltage selection circuit 24.

In this embodiment, as described with reference to FIG. 13, a relatively small voltage is applied to the drain selection line SGD and the dummy word line DWLd at the time t301 to t302. Therefore, it is desirable to charge not only the word line WL but also the drain selection line SGD and the dummy word line DWLd.

Therefore, in this embodiment, as described with reference to FIG. 15, in addition to the charging of the word line WL using the equalizer circuit EQ2, the charging of the drain selection line SGD and the dummy word line DWLd is performed using the voltage selection circuit 24.

Here, as described above, the electrical resistance value of the current path between the voltage selection circuit 24 and the word line WL may be relatively large. However, in this embodiment, since the word line WL is charged using the equalizer circuit EQ2, the wiring CG corresponding to the word line WL can be charged at a relatively high speed. Therefore, it is possible to increase the speed of the charging of the drain selection line SGD and the dummy word line DWLd by increasing the ratio of the current flowing through the drain selection line SGD and the dummy word line DWLd through the voltage selection circuit 24.

Other Embodiments

The above embodiments are merely examples, and specific aspects may be changed as appropriate.

For example, in the configuration described with reference to FIG. 3, the memory area MA is divided into the total of 16 sub-divisions aligned in fours along the Y direction and the X direction, and the memory cell array MCA is provided in each of the sub-divisions. However, in general, the memory area MA may be divided into two sub-divisions, four sub-divisions, or may be divided into any number of sub-divisions. In addition, in the example of FIG. 3, the peripheral area PA is provided only at one end of the substrate S, but in other examples, the peripheral area PA may be provided in the vicinity of the center of the substrate S. In addition, in the example of FIG. 3, the equalizer circuit EQ1 and the source line driver SD are provided in two smaller regions, but may instead be provided one smaller region, four smaller regions, or any number of smaller regions (sub-regions) in the memory area MA.

In the configuration described with reference to FIG. 6, the lower end of the semiconductor layer 120 is connected to the source line SL through the substrate S. However, the source line SL may instead be directly connected to the lower end of the semiconductor layer 120. In this case, the source line SL may be configured to extend in at least one of the X direction or the Y direction. In such a case, a plurality of transistors, contact electrodes, and wirings which configures the peripheral circuits such as the block selection circuit 23 and the sense amplifier 25 may be provided between the substrate S and the source line SL.

In addition, as described with reference to FIG. 7 and the like, at the time t101 to t102 of the first embodiment and the time t201 to t202 of the second embodiment, the voltage VERA' is applied to all the dummy word lines DWL and all the selection gate lines (SGD, SGS). On the other hand, as described with reference to FIG. 10 and the like, at the time t301 to t302 of the third embodiment, the voltage VCGRV is applied to the drain selection line SGD and the dummy word line DWLd. However, the voltage VCGRV may be applied to the drain selection line SGD and the dummy word line DWLd at the time t101 to t102 of the first embodiment and the time t201 to t202 of the second embodiment, and voltage VERA' may be applied to all the dummy word lines DWL and all the selection gate lines (SGD, SGS) at the time t301 to t302 of the third embodiment.

Figure 16:
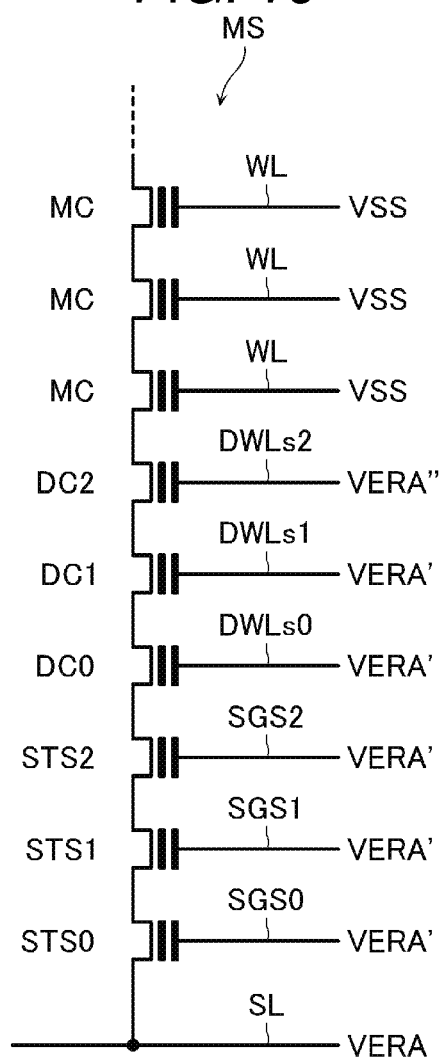
FIG. 16 is a circuit diagram of a memory string in a semiconductor storage device according to another embodiment.

In addition, as shown in FIG. 16, the memory string MS may include dummy cells DC0, DC1, and DC2, and selection transistors STS0, STS1, and STS2. In this case, dummy word lines DWLs0, DWLs1, and DWLs2 connected to the gate electrodes of the dummy cells DC0, DC1, and DC2 may be able to be independently controlled or otherwise may be collectively controlled in groups or as a single group. Similarly, source selection lines SGS0, SGS1, SGS2 respectively connected to the gate electrodes of the selection transistors STS0, STS1, STS2 may be able to be independently controlled or otherwise may be collectively controlled in groups or as a single group. FIG. 16 illustrates an example in which at the time t101 to t102, the voltage VSS is applied to the plurality of word lines, the voltage VERA' is applied to the source selection lines SGS0, SGS1, SGS2 and the dummy word lines DWLs0 and DWLs1, and a voltage VERA" is applied to the dummy word line DWLs2. The voltage VERA" is a voltage having a magnitude between the voltage VSS and the voltage VERA. In addition, while FIG. 16 illustrates a configuration on a source side of the memory string MS, the same can be applied to a configuration of a drain side of the memory string MS.

In addition, as described with reference to FIG. 12, in the equalizer circuit EQ2 according to the third embodiment, the common wiring GEQ2 is connected to the gate electrodes of the transistors 44 corresponding to the dummy word lines DWLd and DWLs. In addition, the common wiring GEQ3 is connected to the gate electrodes of the transistors 44 corresponding to the selection gate lines (SGD, SGS). However, in other examples, electrically independent wirings may be connected to the gate electrodes of each of the transistors 44 corresponding to the dummy word lines DWLd and DWLs, respectively. Similarly, electrically independent wirings may be connected to the gate electrodes of the transistors 44 corresponding to the selection gate lines (SGD, SGS).

Others

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a first memory string unit including a first memory string, the first memory string having a first string selection transistor at a first end and a second string selection transistor at a second end, a plurality of memory cell transistors being connected in series between the first and second string selection transistors;
a bit line connected to an end of the first string selection transistor;
a source line connected to an end of the second string selection transistor;
a word line connected to a gate of a memory cell transistor in the plurality of memory cell transistors;
a first selection line connected to a gate of the first string selection transistor;
a second selection line connected to a gate of the second string selection transistor;
a block selection circuit including a plurality of block selection transistors respectively connected to the first selection line, the word line, and the second selection line,
an equalizer circuit including a first connection transistor having a first end connected to the first selection line via the block selection circuit and a second end connected to the source line, a second connection transistor having a first end connected to the word line via the block selection circuit and a second end connected to the source line, and a third connection transistor having a first end connected to the second selection line via the block selection circuit and a second end connected to the source line; and
a sequencer configured to switch the first, second, and third connection transistors from a non-conductive state to a conductive state after an erase voltage has been applied to the source line during an erasing operation.

2. The semiconductor storage device according to claim 1, further comprising:
a source line driver connected to the source line and configured to supply voltages to source line; and
a fourth connection transistor connected between the equalizer circuit and the source line driver, the fourth connection transistor being between the source line driver and the source line and configured to electrically connect and disconnect the source line driver from the source line.

3. The semiconductor storage device according to claim 2, further comprising:
a plurality of memory cell array areas, each including a plurality of memory blocks including a plurality of memory strings, wherein
the source line driver and the equalizer circuit are between adjacent memory cell array areas of the plurality of memory cell array areas, and
one of the adjacent memory cell array areas includes a memory block including the first and second memory strings.

4. The semiconductor storage device according to claim 2, wherein gates of the first, second, and third connection transistors are connected to each other in common.

5. The semiconductor storage device according to claim 1, wherein gates of the first, second, and third connection transistors are connected to each other in common.

6. The semiconductor storage device according to claim 1, wherein the equalizer circuit further includes:
a fourth connection transistor connected between the second end of the first connection transistor and the source line;
a fifth connection transistor connected between the second end of the second connection transistor and the source line; and
a sixth connection transistor connected between the second end of the third connection transistor and the source line.

7. The semiconductor storage device according to claim 6, wherein the first, second, and third connection transistors are a first type of field effect transistor and the fourth, fifth, and sixth connection transistors are a second type of field effect transistor different from the first type.

8. The semiconductor storage device according to claim 1, wherein the plurality of memory cell transistors includes at least one dummy memory cell transistor.

* * * * *